(12) United States Patent  
Raghavan et al.

(10) Patent No.: US 7,929,363 B1  
(45) Date of Patent: Apr. 19, 2011

(54) MEMORY TEST AND SETUP METHOD

(75) Inventors: Vijay Kumar Srinivasa Raghavan, Colorado Springs, CO (US); Leonard Gitlan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 473 days.

(21) Appl. No.: 12/075,552

(22) Filed: Mar. 12, 2008

Related U.S. Application Data

(60) Provisional application No. 61/067,149, filed on Feb. 26, 2008.

(51) Int. Cl.
*G11C 7/00* (2006.01)

(52) U.S. Cl. ........................................................ 365/201

(58) Field of Classification Search .................... 365/201
See application file for complete search history.

(56) References Cited

U.S. PATENT DOCUMENTS

| | | | | |
|---|---|---|---|---|
| 6,055,189 A | * | 4/2000 | Ogane | 365/185.22 |
| 2004/0136236 A1 | * | 7/2004 | Cohen | 365/185.2 |
| 2005/0052930 A1 | * | 3/2005 | Noda et al. | 365/222 |
| 2005/0057994 A1 | * | 3/2005 | Mitani | 365/222 |
| 2005/0146936 A1 | * | 7/2005 | Jenq et al. | 365/185.17 |
| 2006/0158932 A1 | * | 7/2006 | Tamada et al. | 365/185.2 |
| 2007/0257302 A1 | * | 11/2007 | Kang et al. | 257/315 |

OTHER PUBLICATIONS

Azeez J. Bhavnagarwala et al.; "The Impact of Intrinsic Device Fluctuations on CMOS SRAM Cell Stability"; IEEE Journal of Solid-State Circuits, vol. 36, No. 4, Apr. 2001, pp. 658-665.*

* cited by examiner

*Primary Examiner* — Huan Hoang  
*Assistant Examiner* — Jay Radke

(57) ABSTRACT

A method of optimizing memory cell write/read is disclosed. The memory cell write/read is optimized by first reading the memory cell data using the normal mode. Next the page latch data that was used to NV (Non-Volatile) write the memory is also read back directly from the page latches. The two data are then compared to verify a successful and optimized memory cell write/read. NV writes and reads are performed with various high voltage parameters and sense amplifier reference settings to arrive at the most optimal one that gives the largest sense window for best write/read reliability. The page latch read mode is also used as a DFT (Design for Test) test mode to check for page latch functionality and page address uniqueness without having to write the memory cell. The page latch is written with logic data and read out directly using the page latch read mode to verify page functionality.

16 Claims, 2 Drawing Sheets

MEMORY TEST AND SETUP METHOD

RELATED APPLICATIONS

The present invention claims priority on provisional patent application, Ser. No. 61/067,149, filed on Feb. 26, 2008, entitled "Page Latch Read Scheme for Non Volatile Memory Write/Read Verification" and is hereby incorporated by reference.

STATEMENT REGARDING FEDERALLY SPONSORED RESEARCH

Not Applicable

THE NAMES OF THE PARTIES TO A JOINT RESEARCH AGREEMENT

Not Applicable

REFERENCE TO A SEQUENCE LISTING, A TABLE, OR A COMPUTER PROGRAM LISTING

Not Applicable

BACKGROUND OF THE INVENTION

It is necessary for non-volatile memories to verify that data is being correctly written into the memory cells. Present non-volatile memories use an external shadow memory, flip flops, microprocessor's memory and/or additional databus elements to store/transfer data that was written to the page latch and then a normal Flash Macro/EEPROM read is performed to compare the read data against the page latch data from the shadow memory or flip flops.

Unfortunately, the external shadow memory, flip flops and/or databus elements require additional silicon area and control logic for storage/transmission of page latch data. This adds to the cost and complexity of the memory chip.

To test for page address uniqueness and page latch functionality present systems write the memory cells through the page latches and then read back in the normal read mode for functionality verification.

Checking for page latch functionality by writing the memory cells takes a very long time (in the order of tens of milliseconds) due to long high voltage cycles required for writing the memory.

Thus there exists a need for a non-volatile memory system that does not require additional circuitry to verify that data is being correctly written and that does not require a long time to check the page latch functionality of a chip.

BRIEF SUMMARY OF INVENTION

The present invention overcomes these problems by first reading the memory cell data using the normal mode. Next the page latch data that was used to NV (Non-Volatile) write the memory is also read back directly from the page latches. The two data are then compared to verify a successful and optimized memory cell write/read. NV writes and reads are performed with various high voltage parameters and sense amplifier reference settings to arrive at the most optimal one that gives the largest sense window for best write/read reliability.

The page latch read mode is also used as a DFT (Design for Test) mode to check for page latch functionality and page address uniqueness without having to write the memory cell. The page latch is written with logic data and read out directly using the page latch read mode to verify page functionality. This does not require a write to the memory cell and hence does not require long high voltage write cycles (in the order of tens of milliseconds). One page latch read cycle can be done in a few tens of nanoseconds.

DETAILED DESCRIPTION OF THE INVENTION

The present invention is directed to a method of optimizing memory cell write/read and a fast method of checking page latch circuit functionality. The memory cell write/read is optimized by first reading the memory cell data using the normal mode. Next the page latch data that was used to NV (Non-Volatile) write the memory is also read back directly from the page latches. The two data are then compared to verify a successful and optimized memory cell write/read. NV writes and reads are performed with various high voltage parameters and sense amplifier reference settings to arrive at the most optimal one that gives the largest sense window for best write/read reliability.

The page latch read mode is also used as a DFT (Design for Test) mode to check for page latch functionality and page address uniqueness without having to write the memory cell. The page latch is written with logic data and read out directly using the page latch read mode to verify page functionality. This does not require a write to the memory cell and hence does not require long high voltage write cycles (in the order of tens of milliseconds). One page latch read cycle can be done in a few tens of nanoseconds.

Figure 1:
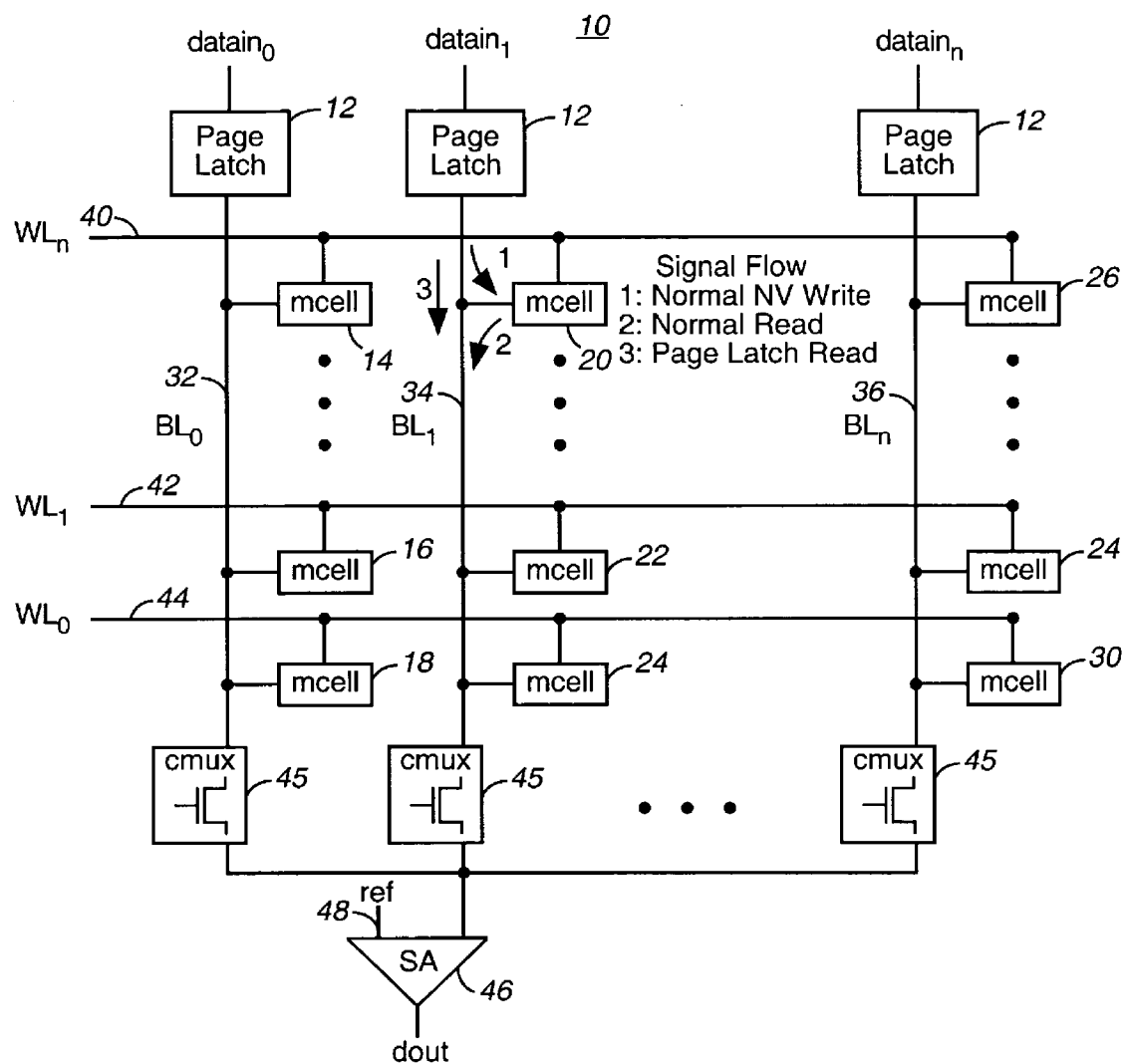
FIG. 1 is a block diagram of a non-volatile memory system in accordance with one embodiment of the invention.

FIG. 1 is a block diagram of a non-volatile memory system 10 in accordance with one embodiment of the invention. The normal NV write mode first writes logic data to the page latch 12 which translates the data into the correct high voltages (HV). The page latch 12 data is written to the memory cells 14, 16, 18, 20, 22, 24, 26, 28, 30 by passing appropriate high voltage (HV) onto the bitlines 32, 34, 36 (arrow 1). The wordlines 40, 42, 44 also get appropriate high voltage from the HV row drivers. The value of the high voltage and the program/erase pulse widths determine the memory cell threshold voltage. This determines the read current window (the difference between the erase and program memory cell currents). For better read reliability, the read current window needs to be optimized by appropriately setting the high voltage parameters for NV write cycles. To see if the current window is set properly, the memory cell 20 data is then read using the normal mode (arrow 2). The page latch 12 data that was used to NV write the memory 20 is also read back through the column multiplexer 45 from the page latches (arrow 3). The two data are then compared to verify a successful and optimized memory cell write/read. NV writes and reads are performed with various high voltage parameter and sense amplifier 46 reference setting 48 to arrive at the most optimal one that gives the largest sense window for best write/read reliability.

Note that the high voltage (HV) as used herein is any voltage above VCC or below ground (or low voltage supplied by the power supply).

To optimize the system, the memory array is first written with the erased state using an initial set of HV parameters. The erased cells are read with an initial sense reference 48 current setting and the reference changed until the point of failure. Then the memory array is written with program cells and are then read with an initial sense reference current 48 setting and the reference changed until the point of failure. The center of the two reference currents at which the erase and the program cell starts failing is the most optimal reference current for the given HV write parameters. Now, the HV parameters to write the memory cell are changed and the steps to achieve the best reference setting are performed until the best HV write parameters and reference current 48 settings are achieved.

In order to directly read the page latch 12 data, the existing read sense path is used with the following modifications. In the page latch read mode, all the wordlines 40, 42, 44 are turned OFF so that the memory cell 14, 16, 18, 20, 22, 24, 26, 28, 30 data does not interfere with the page latch 12 data. The page latch 12 drives the bitline 34 directly with the logic data in it. This signal that the page latch 12 drives onto the bitline 34 can either be a current signal (in case of a current sensing scheme) or an analog voltage signal (in case of a voltage sensing scheme). For a voltage sensing read scheme, the corresponding low or high power supply is driven by the page latch 12. For a current sensing scheme, a high current sink state can be achieved by driving a low power supply on to the bitline 34 (a low impedance level) and a low current sink state can be achieved by driving a high impedance level (page latch output tri-stated) on the bitline 34 from the page latch side. The sense amplifier 46 then senses the data on the bitline 34 to read the page latch 12 data. This is then used to compare against the corresponding memory cell data read in the normal read mode. Similar operations can be done to read the other page latch's data.

Figure 2:
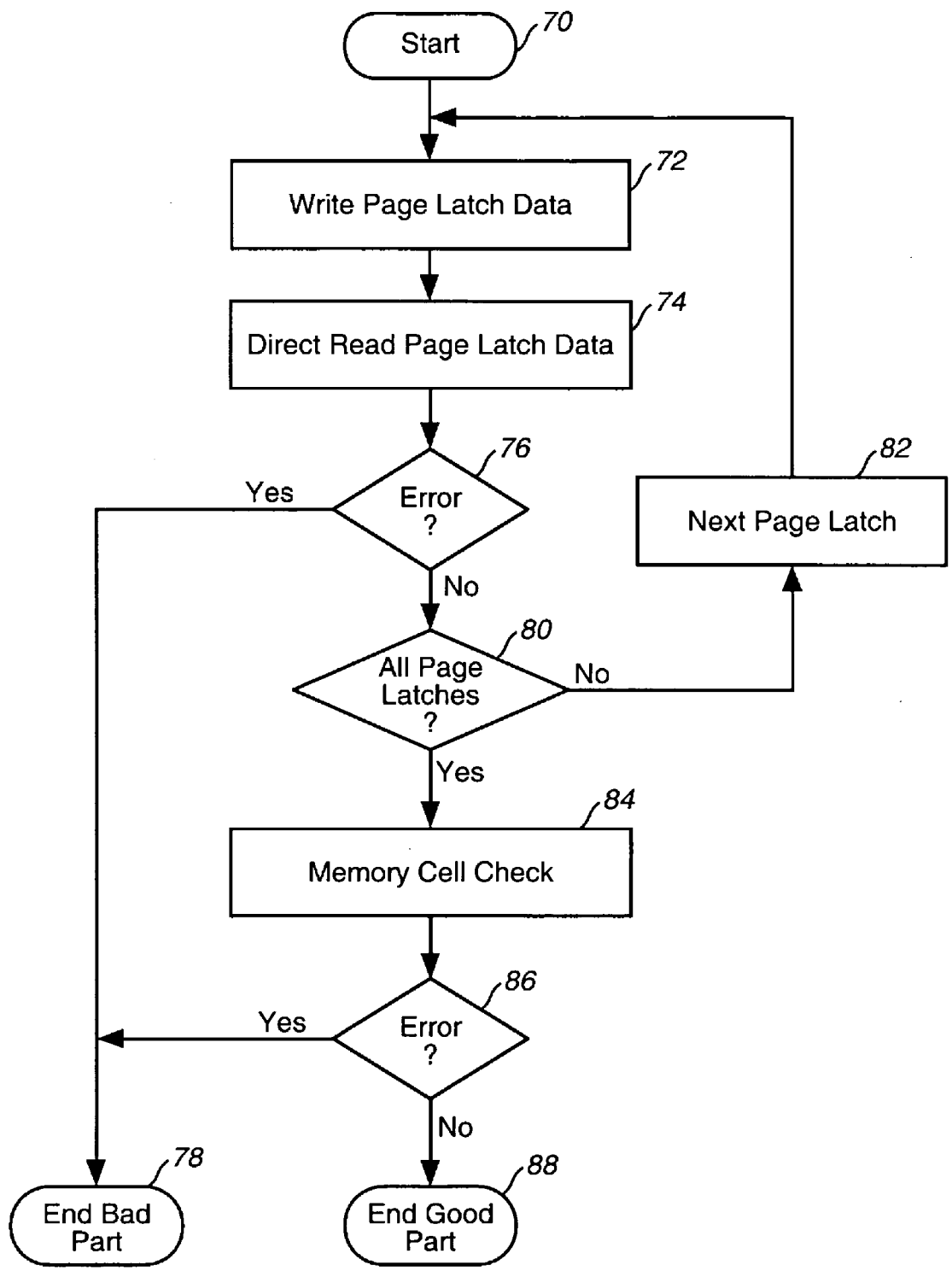
FIG. 2 is a flow chart of the process for testing page latch circuits of a non-volatile memory system in accordance with one embodiment of the invention.

FIG. 2 is a flow chart of the process for testing page latch circuits of a non-volatile memory system in accordance with one embodiment of the invention. The page latch read mode is also used as a DFT (Design for Test) mode to check for page latch functionality and page address uniqueness without having to write the memory cell. The process starts, step 70, when the page latch is written, step 72, with logic data and read out, step 74, directly using the page latch read mode to verify page functionality. When there is an error, step 76, then testing stops and the chip is rejected, step 78. If there is not an error, step 76, the process determines if all the page latches have been checked at step 80. If not all page latches have been checked, step 80, the next page latch is selected, step 82. Once all the page latches are tested and function, step 80, then a memory cell check, step 84, is performed. If there is an error, step 86, in the memory check the part is rejected at step 78. When no error is found, step 86, then the part is good, step 88. The page latch test does not require a write to the memory cell and hence does not require long high voltage write cycles (in the order of tens of milliseconds) to check the page latch circuits. One page latch read cycle can be done in a few tens of nanoseconds. Thus if an error is discovered in the page latch circuits, the test time is significantly reduced.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A method of testing and optimizing a memory, comprising:
   a) reading a memory cell data;
   b) reading a page latch data directly without writing the memory cell by driving a high impedance level from the page latch onto the bit line; and
   c) comparing the memory cell data to the page latch data to dynamically determine an adjustment to a sense window for the memory cell.

2. The method of claim 1, wherein (a) further includes:
   a1) writing a page latch;
   a2) writing a memory cell.

3. The method of claim 1, further including:
   d) determining if a memory cell read/write is optimized;
   e) when the memory cell read/write is not optimized, adjusting a high voltage level of the page latch memory;
   f) repeating actions a, b, c, d and e.

4. The method of claim 1, further including:
   d) determining if a memory cell read/write is optimized;
   e) when the memory cell read/write is not optimized, adjusting a pulse width of the page latch memory;
   f) repeating actions a, b, c, d and e.

5. The method of claim 1, further including:
   d) determining if a memory cell read/write is optimized;
   e) when the memory cell read/write is not optimized, adjusting a reference voltage of a sense amplifier,
   f) repeating actions a, b, c, d and e.

6. The method of claim 1, wherein reading the page latch data includes turning off the wordline.

7. The method of claim 6, further including driving a low power supply onto a bitline.

8. A method of testing and optimizing a memory, comprising:
   a) writing data to a page latch;
   b) performing a direct read of the page latch by directly driving a bit line with the data written to the page latch and by driving a high impedance level from the page latch onto the bit line; and
   c) when there is an error, rejecting a part.

9. The method of claim 8, further including:
   d) when there is not the error, determining if all of a plurality of page latches have been tested;
   e) when all of the plurality of page latches have not been tested, repeating actions a-d.

10. The method of claim 9, further including:
    f) when all of the page latches have been tested, performing a memory cell check;
    g) determining if the memory cell check detects an error.

11. The method of claim 10, further including:
    h) when the memory cell check detects the error, rejecting the part.

12. A method of testing and optimizing a memory, comprising the steps of:
    a) reading a memory cell data;
    b) directly reading a page latch data without writing data to the memory cell by driving a high impedance level from the page latch onto the bit line;
    c) comparing the memory cell data to the page latch data; and
    d) optimizing a write/read for the memory cell by comparing the memory cell data to the page latch data to dynamically determine an adjustment to a sense window for the memory, cell.

13. The method of claim 12, wherein step (a) further includes:
    a1) writing data to a page latch;
    a2) performing a direct read of the page latch; and
    a3) when there is an error, rejecting a part.

14. The method of claim 12, wherein the step of optimizing includes:
   determining if a memory cell read/write is optimized;
   when the memory cell read/write is not optimized, adjusting a high voltage level of the page latch memory.

15. The method of claim 12, wherein the step of optimizing includes:
   determining if a memory cell read/write is optimized;
   when the memory cell read/write is not optimized, adjusting a pulse width of the page latch memory.

16. The method of claim 12, wherein the step of optimizing includes:
   determining if a memory cell read/write is optimized;
   when the memory cell read/write is not optimized, adjusting a reference voltage of a sense amplifier.

\* \* \* \* \*